United States Patent
Butsoongnoen et al.

(10) Patent No.: US 9,224,659 B2
(45) Date of Patent: Dec. 29, 2015

(54) METHOD AND APPARATUS FOR SEMICONDUCTOR TESTING AT LOW TEMPERATURE

(71) Applicant: Microchip Technology Incorporated, Chandler, AZ (US)

(72) Inventors: Santi Butsoongnoen, Muangchacherngsao Chacherngsao (TH); Yutthana Jittabut, Muangchacherngsao Chacherngsao (TH); Phisanu Sombatklung, Muangchacherngsao Chacherngsao (TH); Manuschai Chainok, Muangchacherngsao Chacherngsao (TH); Prasit Sriprasert, Muangchacherngsao Chacherngsao (TH)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 14/204,123

(22) Filed: Mar. 11, 2014

(65) Prior Publication Data

US 2014/0273307 A1 Sep. 18, 2014

Related U.S. Application Data

(60) Provisional application No. 61/784,499, filed on Mar. 14, 2013.

(51) Int. Cl.
*H01L 21/66* (2006.01)
*G01R 1/04* (2006.01)

(52) U.S. Cl.
CPC ............. *H01L 22/12* (2013.01); *G01R 1/0408* (2013.01); *H01L 22/20* (2013.01); *H01L 22/14* (2013.01)

(58) Field of Classification Search
None
See application file for complete search history.

(56) References Cited

U.S. PATENT DOCUMENTS

| | | | |
|---|---|---|---|
| 7,442,739 | B1 | 10/2008 | Hatfield ......................... 524/474 |
| 2002/0132111 | A1 | 9/2002 | Zhou et al. .................... 428/343 |
| 2003/0137317 | A1* | 7/2003 | Kim et al. ..................... 324/765 |
| 2005/0153465 | A1 | 7/2005 | Wada et al. .................... 438/14 |
| 2012/0252142 | A1 | 10/2012 | Abbott ............................ 438/15 |

OTHER PUBLICATIONS

International Search Report and Written Opinion, Application No. PCT/US2014/024413, 13 pages, Oct. 7, 2014.

* cited by examiner

*Primary Examiner* — Alexander Ghyka
(74) *Attorney, Agent, or Firm* — Slayden Grubert Beard PLLC

(57) ABSTRACT

A method for testing a plurality of semiconductor devices arranged on a strip may include forming an array of semiconductor devices on a frame, wherein contact pads of adjacent semiconductor devices are shorted, partially cutting the strip to electrically isolate individual semiconductor devices in the array, placing the strip on an adhesive tape configured to withstand low temperatures (e.g., below −20° C. or below −50° C.), arranging the strip and tape on a test chuck, exposing the test chuck, strip, and tape to temperatures below an ambient temperature and testing the plurality of semiconductor devices while exposed to a low temperature. In one embodiment a KAPTON™ film is used as the adhesive tape.

16 Claims, 5 Drawing Sheets

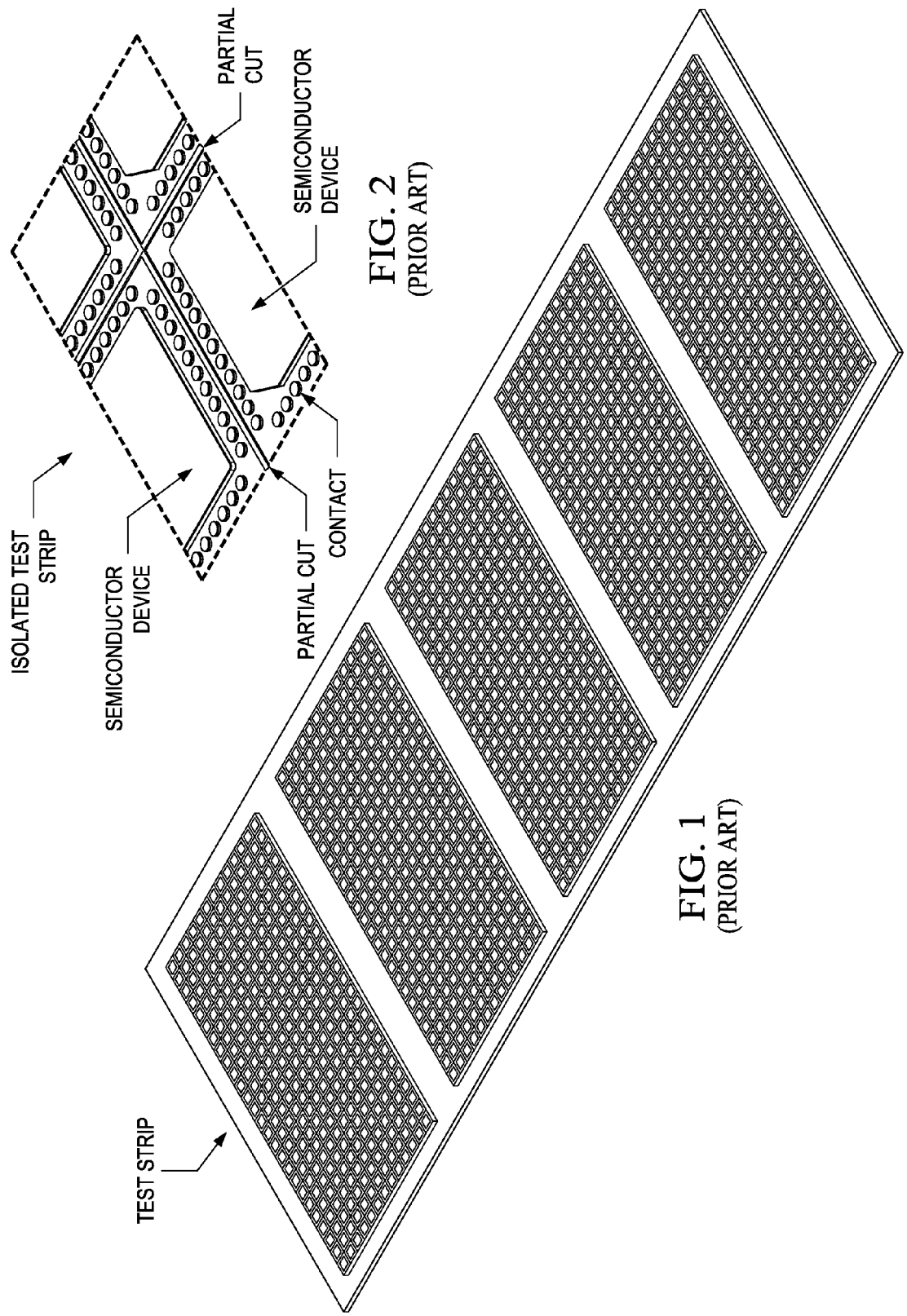

METHOD AND APPARATUS FOR SEMICONDUCTOR TESTING AT LOW TEMPERATURE

CROSS-REFERENCE TO RELATED APPLICATIONS

This application claims the benefit of U.S. Provisional Application No. 61/784,499 filed on Mar. 14, 2013, which is incorporated herein in its entirety.

TECHNICAL FIELD

The present disclosure relates to a method for semiconductor testing, in particular for no-leads-packages isolation (Partial Cut) strip on film frame testing at low temperature.

BACKGROUND

No leads-packages used for semiconductor devices are for example quad-flat no-leads (QFN) or dual-flat no-leads (DFN) packages. Such devices comprise a semiconductor die within a molded housing that comprises no leads. The housing comprises contact pads that do not extend from the housing. In the manufacturing process, a plurality of these devices are placed on a respective QFN/DFN metal "lead frame" and molded together to form a strip including a matrix of a plurality of devices as shown in FIG. 1.

During the conventional QFN/DFN assembly process, the semiconductor devices in the molded strip are shorted together and thus do not allow for testing. Thus, to process this strip as shown in FIG. 1 to a so-called strip test form, the semiconductor devices need to be at least partially isolated prior to testing. This is usually accomplished by a saw blade, laser or water jet. FIG. 2 shows a close-up of several semiconductor devices arranged in a strip after partial isolation. As shown, the devices are cut at a location that separates the contact pads of adjacent semiconductor devices. Some strip warping is often found after such a partial isolation process. However, the strip can still be used for testing in respective machines for ambient or high temperature strip testing.

Certain semiconductor devices, for example devices for the automotive industry, require testing at low temperatures. However, the isolation (partial cut) strip may experience significant warping when exposed to low temperatures, for example at temperatures below −20° C. in an environment chamber due to the property of the metal lead frame (strip). Due to the warping caused by such low temperatures, testing cannot be properly performed, for example, because the warping will cause a vacuum mechanism in a conventional strip test handler to fail. FIGS. 3A and 3B show an example of a warped strip after exposure to low temperatures. For this reason, many semiconductor manufacturers limit the testing of isolation strips to ambient testing and do not perform testing at lower temperatures.

Another attempted solution for strip testing at low temperatures is to leave the semiconductor devices on a film frame after full separation (singulation) of the devices, and perform low temperature testing on the singulated devices. However, tape distortion during the singulation process affects the alignment and/or spacing between devices, leading to problems during subsequent picking of the devices from the frame, and limiting the number of parallelism testing.

Thus, there is a need for an improved manufacturing and/or assembly procedure to allow low temperature testing of semiconductor devices in no-lead packages, e.g., semiconductor devices arranged in an isolation (partially cut) strip.

SUMMARY

One embodiment provides a method for testing a plurality of semiconductor devices arranged on a strip may include forming an array of semiconductor devices on a frame, wherein contact pads of adjacent semiconductor devices are shorted, partially cutting the strip to electrically isolate individual semiconductor devices in the array, placing the strip on an adhesive tape configured for use at temperatures extending below −20° C., arranging the strip and tape on a test chuck, exposing the test chuck, strip, and tape to temperatures below an ambient temperature and testing the plurality of semiconductor devices while exposed to a low temperature.

The adhesive tape may an adhesion of more than 1,200 gf/in before a UV cure and/or an adhesion of less than 10 gf/in after a UV cure. The adhesive tape is configured to withstand up to −50° C. without changing any thermal property of the semiconductor devices arranged on the tape. For example, a KAPTON™ film may be used as the adhesive tape.

Another embodiment provides an apparatus for testing semiconductor devices at low temperature, comprising a test chuck, an adhesive tape arranged on the test chuck, and an isolated test strip arranged on the adhesive tape, the isolated test strip comprising an array of semiconductor devices on a frame and being partially cut to electrically isolate adjacent semiconductor devices in the array. The adhesive tape is configured for use at temperatures extending below −20° C., or below to −50° C. For example, a KAPTON™ film may be used as the adhesive tape. In addition, a metal frame may be arranged over the tape and surrounding the strip.

BRIEF DESCRIPTION OF THE FIGURES

Example embodiments are discussed below with reference to the drawings, in which:

FIG. 1 illustrates an example strip including a plurality of semiconductor devices arranged in an array on a metal lead frame;

FIG. 2 shows a close-up view of a portion of the strip of FIG. 1, with adjacent semiconductor devices being partially isolated by a cut line formed by a saw blade, laser or water jet, to form an isolation strip;

DETAILED DESCRIPTION

As discussed above, the present disclosure provides embodiments for low temperature testing of an isolated (partially cut) semiconductor device test strip, which may avoid or reduce problems associated with convention techniques, such as the problem of lead frame warping during low temperature exposure.

According to various embodiments, to eliminate warping of the semiconductor device strip at low temperature, the semiconductor device test strip is secured to a test chuck using a special adhesive tape, and a frame is applied. In some embodiments, the strip is only partially cut to maintain the devices at their intended position and chip-to-chip spacing, suitable for performing proper testing. A frame is then placed over the strip-adhesive tape assembly. This measure has been proven to be effective and reliable over time without changing any product characteristic of the IC testing strip.

Figures 3A, 3B:
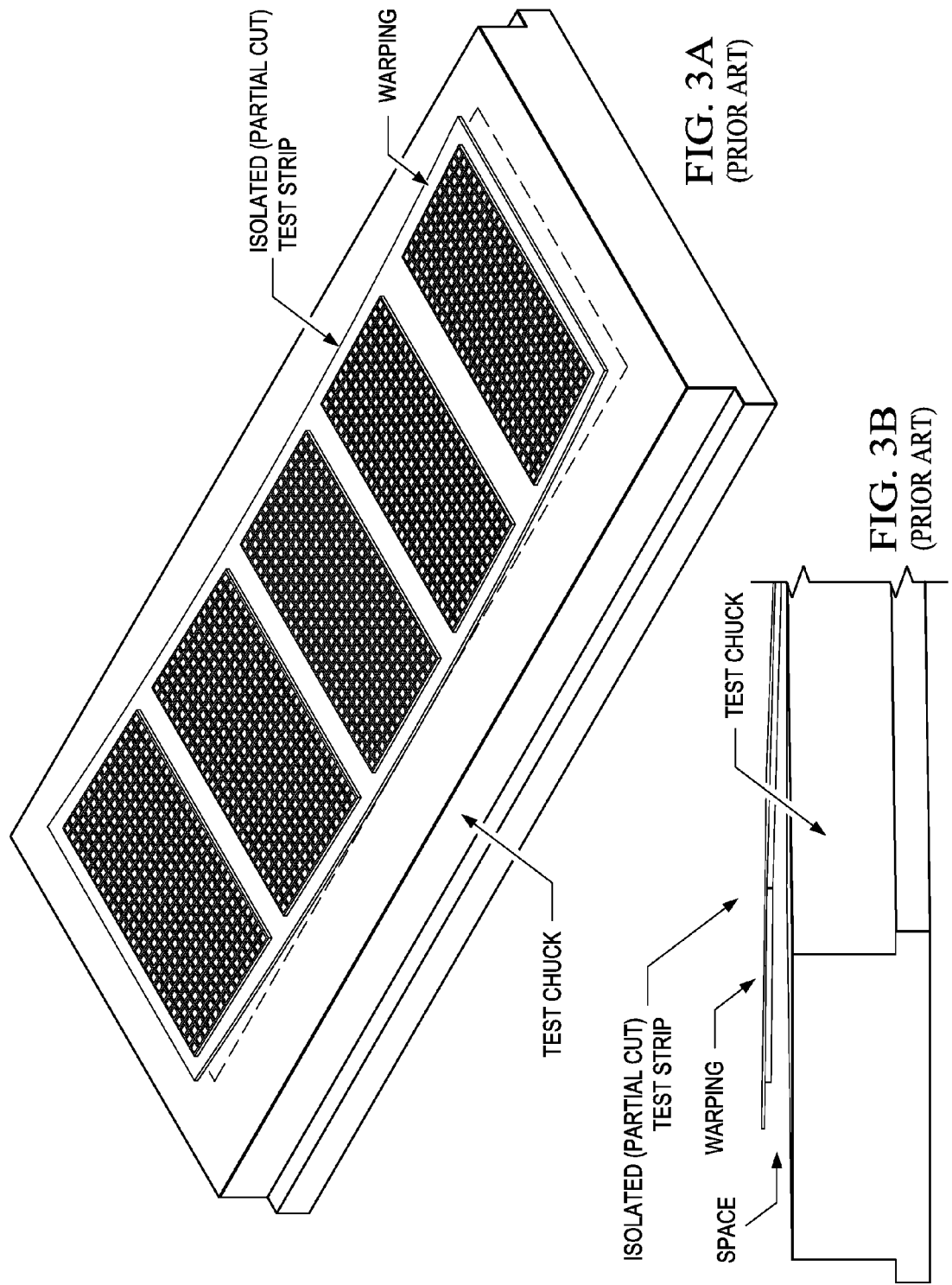
FIGS. 3A and 3B show the isolation strip of FIG. 2 arranged on a test chuck, with the isolation strip being warped by exposed to low temperature.
Figure 4A:
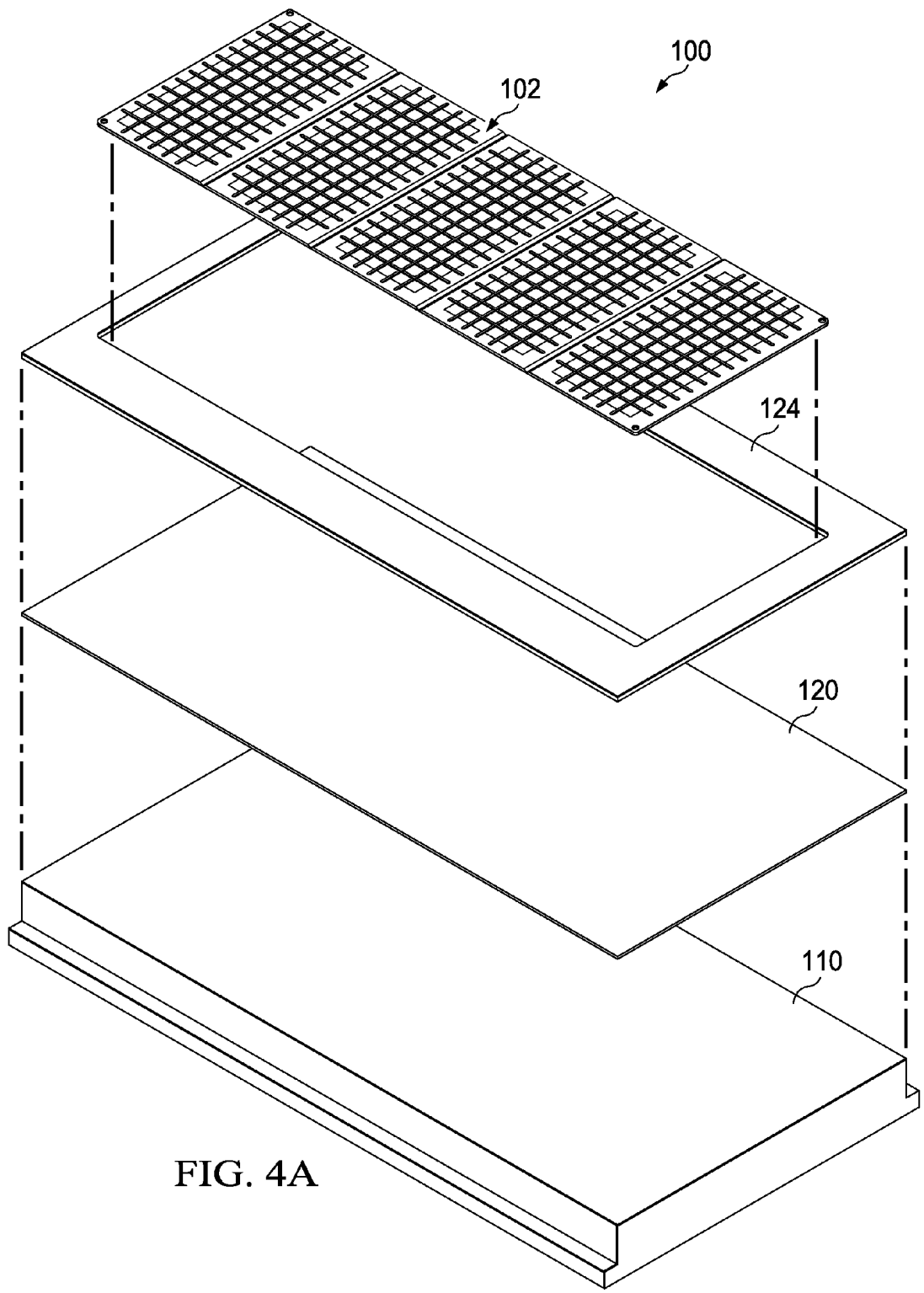
FIGS. 4A and 4B illustrate an example apparatus for low temperature testing of a partially cut test strip, including an adhesive tape for securing the partially cut test strip to a test strip during low temperature testing, according to an example embodiment.
Figure 4B:
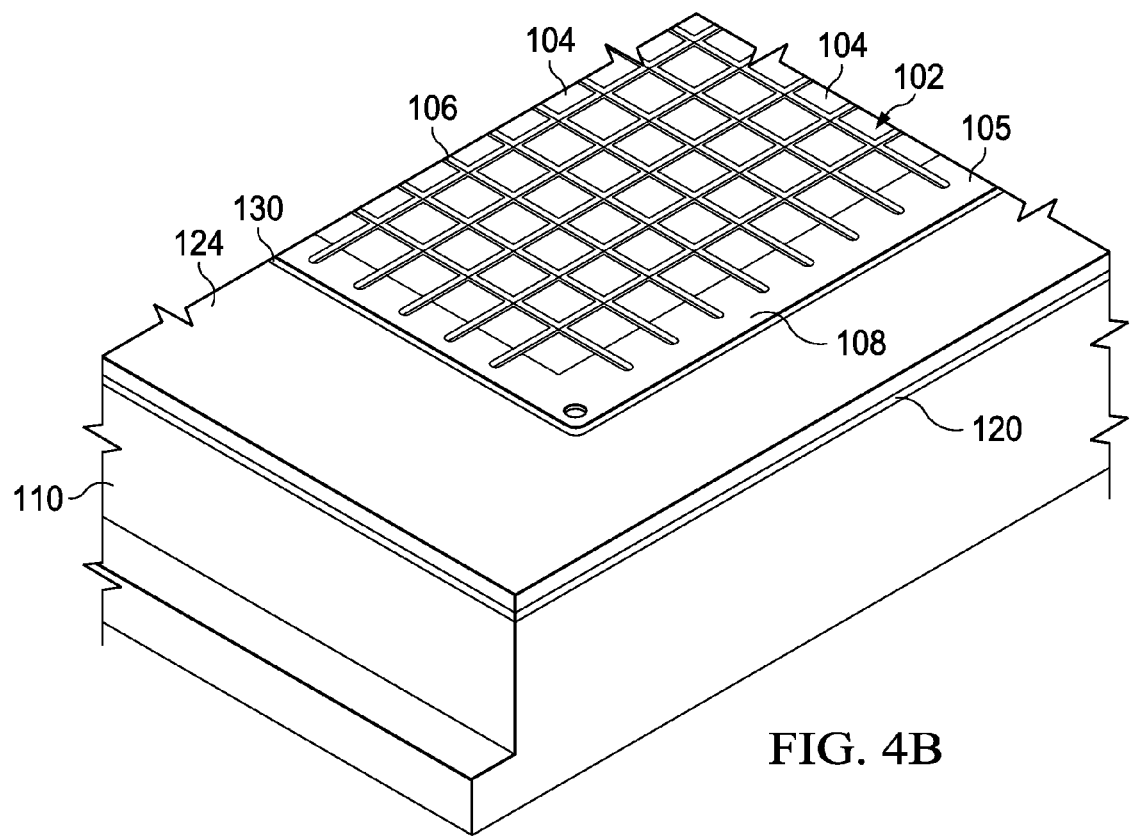

FIGS. 4A and 4B illustrate an example apparatus 100 for low temperature testing of a partially cut test strip, according to an example embodiment. FIG. 4A shows an exploded view of apparatus 100, while FIG. 4B shows a partial assembled view of apparatus 100. As shown, apparatus 100 includes a test strip 102 including a two-dimensional array of semiconductor devices (e.g., chips) 104 on a lead frame 105, a test chuck 110 for supporting test strip 102, an adhesive tape (or film) 120, and an optional metal frame 124. The adhesive tape 120 is applied to a top surface of test chuck 110, and the test strip 102 is then mounted onto the adhesive tape 120. The optional metal frame 124 may also be mounted onto the adhesive tape 120 in an manner that surrounds test strip 102.

Test strip 102 may be partially cut, e.g., using a saw blade, laser or water jet, to isolate the individual semiconductor devices 104 from each other, as indicated by cut lines 106 between adjacent semiconductor devices 104. This isolation is provided to avoid shorting between the semiconductor devices 104 during testing.

The adhesive tape or film 130 may configured to withstand low temperatures, e.g., extending below −20° C. or even below −50° C., while maintaining sufficient adhesion and without changing any thermal property of the overlying semiconductor devices 104. In some embodiments, adhesive tape 130 provides more than 1,200 gf/in adhesion between the test chuck 110 and test strip frame 105 (e.g., SUS304 stainless steel) at both ambient temperatures and low temperatures, e.g., below −20° C. or below −50° C. This adhesion may reduce or eliminate the possibility of the isolation (partially cut) test strip 102 from deforming, e.g., warping, under all testing temperatures. In some embodiments, the adhesive tape 130 also provides less than 10 gf/in adhesion between the adhesive tape 130 and test strip frame 105 after being UV cured, which substantially reduces or eliminates residue remaining on the test strip lead frame 105 after the tape demounting process. In some embodiments, the adhesive tape 130 is a KAPTON™ film.

Figure 5:
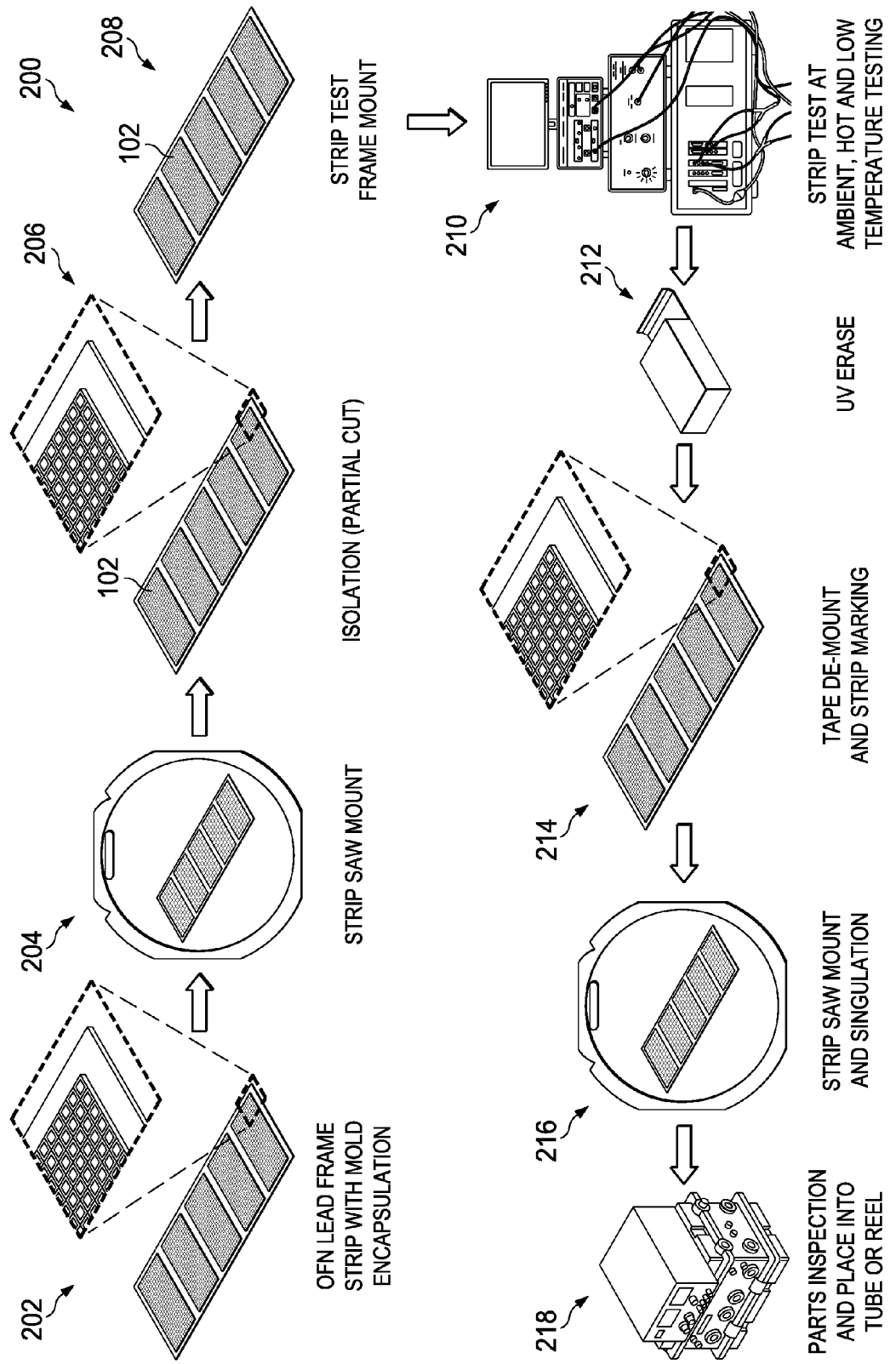
FIG. 5 illustrates an example method 200 of a low temperature testing process using an example apparatus as shown in FIGS. 4A and 4B.

FIG. 5 illustrates an example method 200 of a low temperature testing process using an example apparatus 100 as shown in FIGS. 4A and 4B. At step 202, a DFN/QFN lead frame strip with molded encapsulation is formed. A strip saw mount is performed at step 204. Then, at step 206, a partial cut is performed on the test strip to form the isolation test strip 102 shown in FIGS. 4A and 4B. At step 208, the isolation test strip 102 is then mounted to a test chuck 110 using adhesive tape 130, as shown in FIGS. 4A and 4B. At step 210, the mounted test strip 102 is tested at ambient, hot, and cold (e.g., below −20° C. or below −50° C.) temperatures. A UV erase is then performed at step 212. A tape de-mount and strip marking may then be performed at step 214. At step 216, the test strip may be saw mounted and singulated. Finally, at step 218, the singulated devices (e.g., chips) may be inspected and placed into a tube or reel.

The arranged of FIGS. 4A and 4B and process of FIG. 5 may allow for an increasing DFN/QFN parallelism at low temperature film frame testing. Furthermore, the package size limitation on wide range temperature testing may be eliminated. Finally, conversion time or change over tool costs may be reduce or eliminated.

Although the disclosed embodiments are described in detail in the present disclosure, it should be understood that various changes, substitutions and alterations can be made to the embodiments without departing from their spirit and scope.

What is claimed is:

1. An apparatus for testing semiconductor devices at low temperature, comprising:
   a test chuck;
   an adhesive tape arranged on the test chuck; and
   an isolated test strip arranged on the adhesive tape, the isolated test strip comprising an array of semiconductor devices on a frame and being partially cut to electrically isolate adjacent semiconductor devices in the array;
   wherein the adhesive tape is configured to resist warping of the isolated test strip away from the test chuck at temperatures extending below −20° C.

2. The apparatus according to claim 1, further comprising a metal frame arranged over the tape and surrounding the strip.

3. The apparatus according to claim 1, wherein the strip is partially sawed such that side rails remain on the strip.

4. The apparatus according to claim 1, wherein the adhesive tape has an adhesion of more than 1,200 gf/in before a UV cure.

5. The apparatus according to claim 1, wherein the adhesive tape has an adhesion of less than 10 gf/in after a UV cure.

6. The apparatus according to claim 1, wherein the adhesive tape is configured to withstand up to −50° C. without changing any thermal property of the semiconductor devices arranged on the tape.

7. The apparatus according to claim 1, wherein the adhesive tape is an adhesive film synthesized by polymerizing an aromatic dianhydride and an aromatic diamine.

8. A system for testing a plurality of semiconductor devices arranged on a strip, comprising:
   a test chuck;
   an array of semiconductor devices on a frame, wherein contact pads of adjacent semiconductor devices are shorted, wherein the strip is partially cut to electrically isolate individual semiconductor devices in the array, wherein the strip is placed on an adhesive tape which is arranged on the test chuck and which is configured to resist warping of the isolated test strip away from the test chuck at temperatures extending below −20° C.; and
   wherein the test chuck, strip, and tape are exposed to temperatures below an ambient temperature; and
   wherein the system is configured for testing the plurality of semiconductor devices while exposed to a low temperature.

9. The system according to claim 8, wherein a metal frame is placed on the tape surrounding the strip.

10. The system according to claim 8, wherein the strip is partially sawed such that side rails remain on the strip.

11. The system according to claim 8, wherein the adhesive tape has an adhesion of more than 1,200 gf/in before a UV cure.

12. The system according to claim 8, wherein the adhesive tape has an adhesion of less than 10 gf/in after a UV cure.

13. The system according to claim 8, wherein the adhesive tape is configured to withstand up to −50° C. without changing any thermal property of the semiconductor devices arranged on the tape.

14. The system according to claim 8, wherein the adhesive tape is an adhesive film synthesized by polymerizing an aromatic dianhydride and an aromatic diamine.

15. An apparatus for testing semiconductor devices at low temperature, comprising:
- a test chuck;
- an adhesive tape arranged on the test chuck; and
- an isolated test strip arranged on the adhesive tape, the isolated test strip comprising an array of semiconductor devices on a frame and being partially cut to electrically isolate adjacent semiconductor devices in the array;
- wherein the adhesive tape is configured wherein the adhesive tape is configured to resist warping of the isolated test strip away from the test chuck at temperatures extending below −20° C.
- at temperatures extending below −20° C.,
- wherein the adhesive tape has an adhesion of more than 1,200 gf/in before a UV cure, and
- wherein the adhesive tape has an adhesion of less than 10 gf/in after a UV cure.

16. The apparatus according to claim 15, wherein the adhesive tape is an adhesive film synthesized by polymerizing an aromatic dianhydride and an aromatic diamine.

* * * * *

UNITED STATES PATENT AND TRADEMARK OFFICE
CERTIFICATE OF CORRECTION

| | |
|---|---|
| PATENT NO. | : 9,224,659 B2 |
| APPLICATION NO. | : 14/204123 |
| DATED | : December 29, 2015 |
| INVENTOR(S) | : Santi Butsoongnoen et al. |

Page 1 of 1

It is certified that error appears in the above-identified patent and that said Letters Patent is hereby corrected as shown below:

Claims,
Column 5,
Claim 15 should read, "An apparatus for testing semiconductor devices at low temperature, comprising:
    a test chuck;
    an adhesive tape arranged on the test chuck; and
    an isolated test strip arranged on the adhesive tape, the isolated test strip comprising an array of semiconductor devices on a frame and being partially cut to electrically isolate adjacent semiconductor devices in the array;
    wherein the adhesive tape is configured to resist warping of the isolated test strip away from the test chuck at temperatures extending below -20 °C.
    wherein the adhesive tape has an adhesion of more than 1,200 gf/in before a UV cure, and
    wherein the adhesive tape has an adhesion of less than 10 gf/in after a UV cure."

Signed and Sealed this
Ninth Day of August, 2016

Michelle K. Lee
*Director of the United States Patent and Trademark Office*